United States Patent
Kim (10) Patent No.: US 8,541,889 B2
(45) Date of Patent: Sep. 24, 2013

(54) PROBE CARD INCLUDING FRAME AND COVER PLATE FOR TESTING A SEMICONDUCTOR DEVICE

(75) Inventor: Yang-Gi Kim, Hwaseong-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/301,222

(22) Filed: Nov. 21, 2011

(65) Prior Publication Data

US 2012/0168964 A1 Jul. 5, 2012

(30) Foreign Application Priority Data

Dec. 30, 2010 (KR) .................. 10-2010-0138507

(51) Int. Cl.
*H01L 23/52* (2006.01)
*H01L 21/66* (2006.01)
*G01R 31/26* (2006.01)

(52) U.S. Cl.
USPC ............ 257/777; 257/E23.141; 257/E21.504; 257/686; 257/685; 257/723; 324/756.03

(58) Field of Classification Search
USPC .............. 257/777, 686, 685, 723, 724, 728, 257/774, 773, E21.504, E21.531, E3.141; 324/756, 756.03; 438/15
See application file for complete search history.

(56) References Cited

U.S. PATENT DOCUMENTS

| | | | |
|---|---|---|---|
| 2001/0044171 A1* | 11/2001 | Mess .......................... | 438/127 |
| 2005/0101037 A1* | 5/2005 | Farnworth et al. .............. | 438/14 |
| 2006/0220665 A1* | 10/2006 | Akram et al. .................. | 324/754 |
| 2007/0091570 A1* | 4/2007 | Campbell et al. ............... | 361/699 |
| 2008/0100320 A1* | 5/2008 | Miller et al. .................. | 324/754 |
| 2009/0230981 A1* | 9/2009 | Yasumura et al. .............. | 324/754 |
| 2010/0134129 A1* | 6/2010 | Breinlinger et al. ........... | 324/760 |
| 2010/0167559 A1* | 7/2010 | Cavegn et al. .................. | 439/65 |
| 2011/0001506 A1* | 1/2011 | Washio et al. ............ | 324/756.03 |
| 2011/0234251 A1* | 9/2011 | Komatsu et al. .......... | 324/756.03 |
| 2013/0019461 A1* | 1/2013 | Rudmann et al. ............. | 29/592.1 |

FOREIGN PATENT DOCUMENTS

| | | |
|---|---|---|
| JP | 2005-190589 | 7/2006 |
| JP | 2006-190589 | 7/2006 |
| JP | 2008-306095 | 6/2010 |
| JP | 2010-129505 | 6/2010 |
| KR | 1020070073233 | 7/2007 |
| KR | 102010010961 | 2/2010 |
| KR | 1020100010961 | 2/2010 |

* cited by examiner

*Primary Examiner* — A O Williams
(74) *Attorney, Agent, or Firm* — Muir Patent Consulting, PLLC (57) ABSTRACT

A probe card includes a main circuit board electrically connected to a tester in order to test a plurality of unpackaged sets of chips, a frame provided on the main circuit board and including a plurality of sockets for respectively receiving the unpackaged sets of chips, probe blocks respectively provided in the sockets and including a plurality of probes electrically connected to input/output terminals of the unpackaged sets of chips, and a cover plate positioned over the frame and including a plurality of pressure members for pressurizing the unpackaged sets of chips in the sockets.

20 Claims, 12 Drawing Sheets

PROBE CARD INCLUDING FRAME AND COVER PLATE FOR TESTING A SEMICONDUCTOR DEVICE

PRIORITY STATEMENT

This application claims priority under 35 U.S.C. §119 to Korean Patent Application No. 10-2010-0138507, filed on Dec. 30, 2010 in the Korean Intellectual Property Office (KIPO), the entire contents of which are herein incorporated by reference.

BACKGROUND

Semiconductor packages are becoming miniaturized and lightweight according to a miniaturization trend of electronic products using semiconductor devices. For example, in order to minimize a mounting area, research has been conducted with regard to a stack package including at least two unit semiconductor packages stacked on a wafer.

Examples of a stack package may include, for example, a multi-chip package including stacked semiconductor memory chips or a system-in package including a logic chip having a logic circuit and a memory chip stacked thereon.

A stack package may include a through electrode that penetrates at least one of the semiconductor chips. The through electrode may be a through-substrate via (TSV).

Conventionally, in order to test a stack package with a TSV, a probing test is performed on only one wafer that includes a plurality of semiconductor chips formed therein.

SUMMARY

In one embodiment, a probe card comprises a main circuit board electrically connected to a tester in order to test at least a first unpackaged set of chips and at least a second unpackaged set of chips, a frame provided on the main circuit board, the frame including at least a first socket configured to receive the first unpackaged set of chips and at least a second socket configured to receive the second unpackaged set of chips, and a cover plate positioned over the frame. An exemplary cover plate comprises a first movable member configured to maintain a position of the first unpackaged set of chips in the first socket during testing of the first unpackaged set of chips, and a second movable member configured to maintain a position of the second unpackaged set of chips in the second socket during testing of the second unpackaged set of chips, wherein the first movable member is configured to move independently of the second movable member.

An exemplary method of manufacturing a semiconductor device comprises the steps of: forming a first chip die on a wafer, the first chip die having a through electrode, stacking a second chip die on the first chip die, wherein the second chip die is electrically connected to the first chip die via the through electrode, dicing the wafer to form at least a first unpackaged set of chips including the first chip die and the second chip die, disposing the first unpackaged set of chips in at least a first socket provided on a main circuit board, pressurizing the first unpackaged set of chips such that at least a first connection terminal of the first unpackaged set of chips is in contact with at least a first respective probe of a first probe block disposed on the main circuit board, after pressurizing the first unpackaged set of chips, sending a first test signal via the first probe block and the first probe to test the first unpackaged set of chips, and after testing the first unpackaged set of chips, packaging the first unpackaged set of chips.

An exemplary probe card comprises a main circuit board electrically connected to a tester in order to test at least a first unpackaged set of chips and at least a second unpackaged set of chips, a frame provided on the main circuit board, the frame including at least a first socket configured to receive the first unpackaged set of chips and at least a second socket configured to receive the second unpackaged set of chips, and a cover plate positioned over the frame. An exemplary cover plate comprises a first pressure member configured to pressurize the first unpackaged set of chips, and a second pressure member configured to pressurize the second unpackaged set of chips, wherein the first pressure member pressurizes the first unpackaged set of chips in a manner different than the second pressure member pressurizes the second unpackaged set of chips.

BRIEF DESCRIPTION OF THE DRAWINGS

The above and other aspects and features of the disclosure will become apparent by describing in detail exemplary embodiments thereof with reference to the attached drawings, in which.

DETAILED DESCRIPTION OF EXAMPLE EMBODIMENTS

The present disclosure will be described more fully hereinafter with reference to the accompanying drawings, in which various embodiments are shown. The invention may, however, be embodied in many different forms and should not be construed as limited to the embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items and may be abbreviated "/".

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another element, component, region, layer or section. For example, a first element, component, region, layer or section discussed below could be termed a second element, component, region, layer or section and, similarly, a second element, component, region, layer or section could be termed a first element, component, region, layer or section without departing from the teachings of the disclosure.

Locational terms, such as "beneath," "below," "lower," "above," "upper" and the like, may be used herein for ease of description to describe one element or feature's relationship to another element(s) or feature(s) as illustrated in the figures. It will be understood that the locational terms may be relative to a device and are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the locational descriptors used herein interpreted accordingly.

The terminology used herein is for the purpose of describing particular embodiments only and is not intended to be limiting of the invention. As used herein, the singular forms "a," "an" and "the" should not exclude the plural forms as well, unless the context clearly indicates otherwise. It will be further understood that the terms "comprises" and/or "comprising" or "includes and/or "including" when used in this specification, specify the presence of stated features, integers, steps, operations, elements, and/or components, but do not preclude the presence or addition of one or more other features, integers, steps, operations, elements, components, and/or groups thereof.

Embodiments described herein will be described referring to plan views and/or cross-sectional views by way of ideal schematic views. Accordingly, the exemplar views may be modified depending on manufacturing technologies and/or tolerances. Therefore, the disclosed embodiments are not limited to those shown in the views, but include modifications in configuration formed on the basis of the manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and should not be interpreted in an idealized or overly formal sense unless expressly so defined herein.

Hereinafter, example embodiments will be explained in detail with reference to the accompanying drawings.

Figure 1:
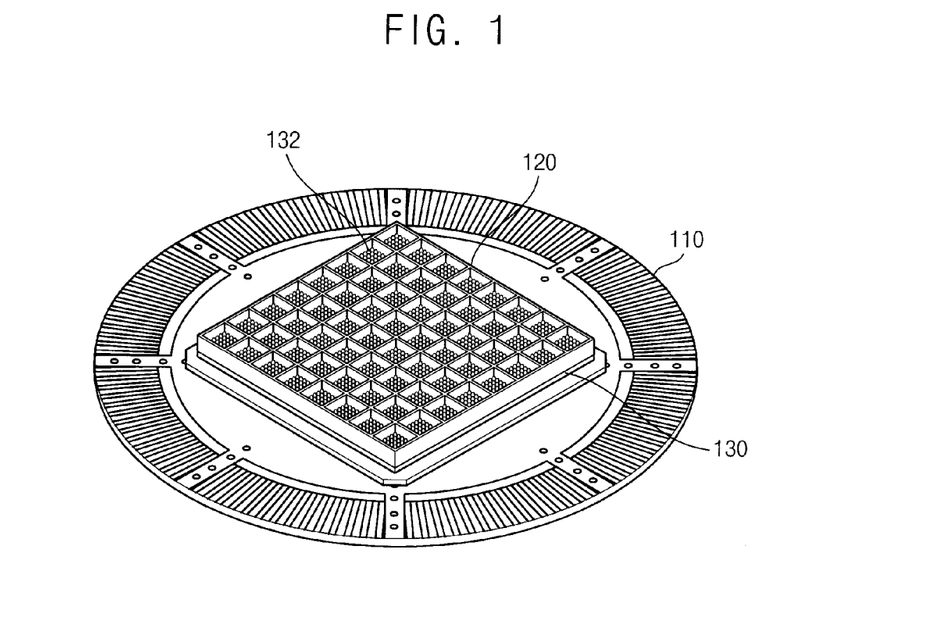
FIG. 1 is a perspective view illustrating an exemplary probe card.
Figure 2:
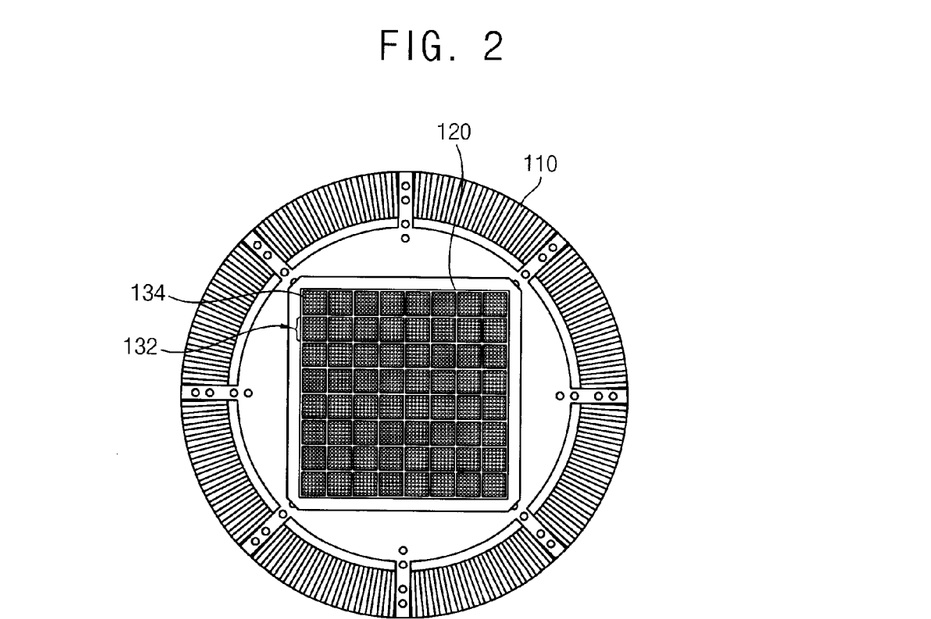
FIG. 2 is an exemplary plan view illustrating the probe card in FIG. 1.
Figure 3:
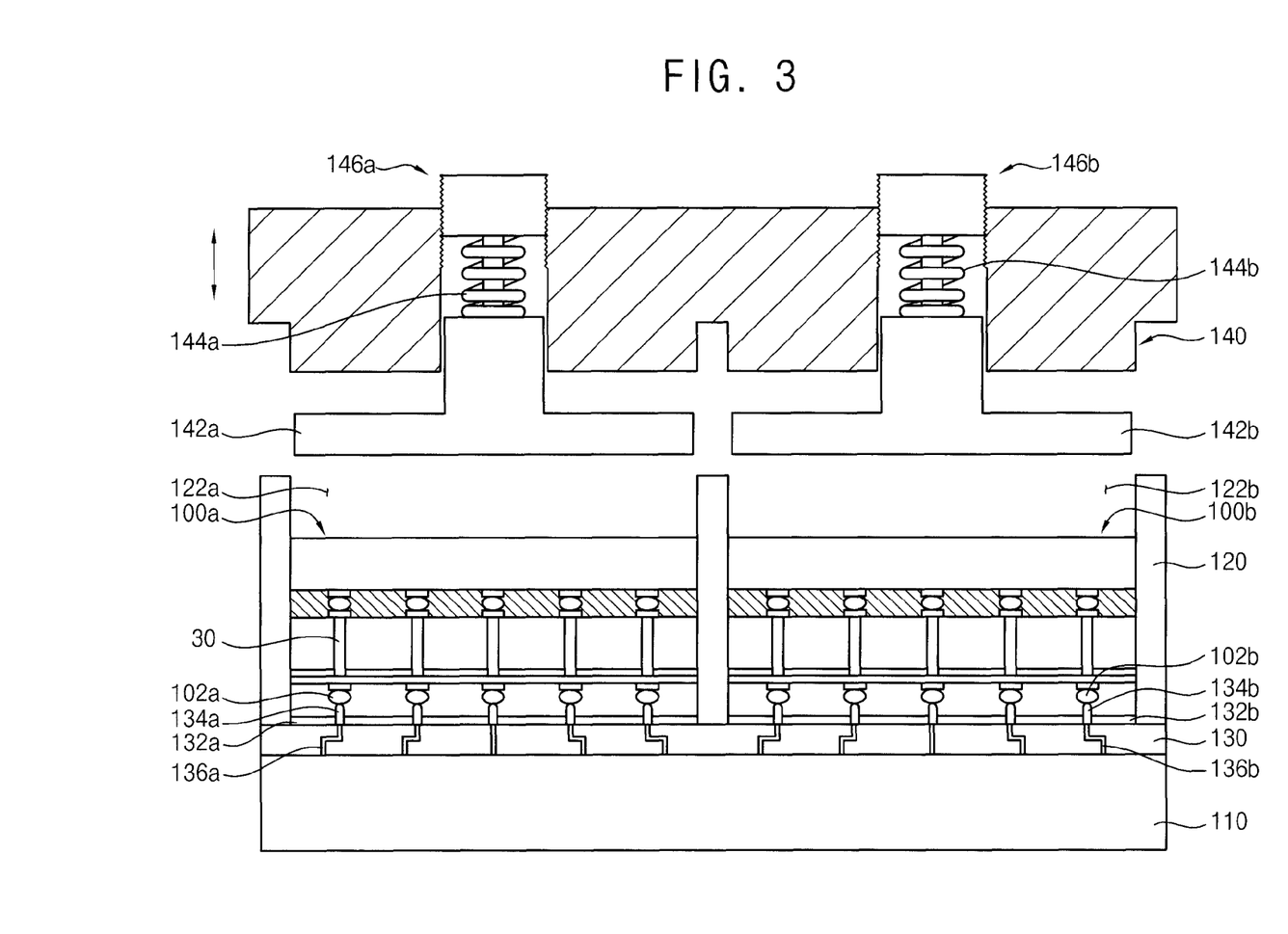
FIG. 3 is an exemplary cross-sectional view illustrating the probe card in FIG. 1.
Figure 4:
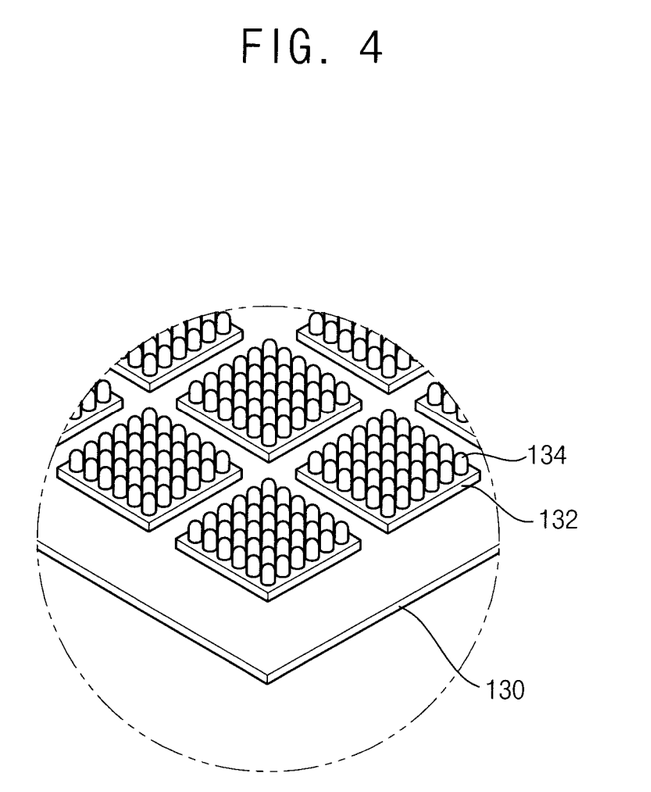
FIG. 4 is an exemplary perspective view illustrating probe blocks of the probe card in FIG. 1

FIG. 1 is a perspective view illustrating an example probe card. FIG. 2 is an exemplary plan view illustrating the probe card in FIG. 1. FIG. 3 is an exemplary cross-sectional view illustrating the probe card in FIG. 1. FIG. 4 is an exemplary perspective view illustrating probe blocks of the probe card in FIG. 1.

Referring to FIGS. 1 to 4, an example probe card includes a main circuit board 110, a frame 120, probe blocks 132, and a cover plate 140.

In example embodiments, the probe card may be supported and handled by a test head (not illustrated) to test a plurality of unpackaged sets of chips 100.

The main circuit board 110 may be electrically connected to a tester (not illustrated) through the test head. The main circuit board 110 may transfer a test signal applied by the tester to a plurality of probes 134 through each of corresponding probe blocks 132, and then, transfer a signal outputted from the chip through the probes 134 to the tester. The main circuit board may be designed and manufactured for its purpose using known techniques and technologies.

In example embodiments, an auxiliary circuit board 130 is provided on the main circuit board 110. For example, the auxiliary circuit board may include a multi-layered ceramic substrate.

A plurality of the probe blocks 132 may be formed on the auxiliary circuit board 130. The probe blocks may be provided regularly or freely on the auxiliary circuit board 130 and may correspond in number to the number of the unpackaged sets of chips 100 to be inspected and/or the wiring patterns of the main circuit board, etc.

The probe block 132 may include a plurality of probes 134 protruding from the upper surface of the probe block 132. As illustrated in FIG. 4, a probe may have a vertical pillar shape. Alternatively, a probe may have a cantilever shape. The shape of a probe is not limited to the examples described herein. The probes 134 may be formed on the auxiliary circuit board 130, for example, by MEMS (micro electro mechanical system) technology.

The auxiliary circuit board 130 may include inner wirings 136. The inner wirings 136 may electrically connect the main circuit board 110 and the corresponding probes 134. In one embodiment, a probe 134a of probe block 132a may be electrically connected to the main circuit board 110 by a set of inner wirings 136a. Similarly, a probe 134b of probe block 132b may be electrically connected to the main circuit board 110 by a set of inner wirings 136b.

The frame 120 may be provided on the main circuit board 110. The probe blocks 132 may be spaced apart from one another by a predetermined distance. The frame 120 may include portions positioned between the probe blocks 132 to provide a plurality of sockets 122 for receiving the unpackaged sets of chips 100. Accordingly, the frame 120 may be provided on the main circuit board 110 to provide spaces for receiving the unpackaged sets of chips 100. As shown in FIG. 3, a portion of frame 120 is positioned between probe blocks 132a and 132b to provide sockets to receive unpackaged sets of chips 100a and 100b.

A cover plate 140 may be positioned over the frame 120. The cover plate 140 may include a plurality of movable members, such as pressure members 142 for exerting pressure on the unpackaged sets of chips 100. In addition, the cover plate 140 may include a plurality of elastic members 144. The pressure members 142 may be elastically supported by the elastic members 144. In example embodiments, the cover plate 140 may further include a plurality of adjustment members 146 for controlling a protruding height of the pressure members 142. For example, an adjustment member 146a having a spiral recess on an outer surface thereof may be combined with the cover plate 140. The height of a pressure member 142a may be controlled, for example, by turning the adjustment member 146a.

Each set of pressure member (e.g. 142a), elastic member (e.g. 144a), and adjustment member (e.g. 146a) may correspond to a unpackaged set of chips (e.g. 100a) disposed in a socket (e.g. 122a) and may be referred to herein generally as a pressure exerting unit. As discussed below, the height and pressure applied by each pressure exerting unit may vary according to the size and/or type of unpackaged set of chips disposed in the socket.

The unpackaged sets of chips 100 may be provided into the sockets 122 of the probe card, such that one unpackaged set of chips (e.g. 100a) of the plurality of unpackaged sets of chips 100 is provided into one corresponding socket (e.g. 122a) of the plurality of sockets 122 of the probe card. In one embodiment, an unpackaged set of chips (e.g., 100a, 100b) may include first chip dies formed on a wafer, with second chip dies stacked thereon, where the wafer has been diced to form the plurality of unpackaged sets of chips 100. In one embodiment, the unpackaged set of chips is not yet packaged. In one embodiment, the unpackaged set of chips is not connected to a package substrate. In one embodiment, the unpackaged set of chips are bare chips, which include a set of chips separated from a wafer that have not yet been packaged and include a set of connection terminals exposed to the outside of the chips. An unpackaged set of chips 100a of the plurality of unpackaged sets of chips 100 may be inserted into a respective socket 122a of the probe card to inspect electrical properties thereof.

In example embodiments, the first chip die of an unpackaged set of chips may include a through electrode 30 that penetrates at least the first chip die. The second chip die may be electrically connected to the first chip die by the through electrode 30. For example, the through electrode may be a through-substrate via (TSV) passing through part or all of the first chip die of an unpackaged set of chips.

In one embodiment, the unpackaged sets of chips 100 may include a plurality of chips and/or chip stacks from a plurality of different wafers. For example, the unpackaged sets of chips 100 may include at least a first unpackaged set of chips 100a from a first wafer and at least a second unpackaged set of chips 100b from a second wafer. In one embodiment, an unpackaged set of chips (e.g. 100a and/or 100b) includes a first chip die and a second chip die stacked on one another, where the first chip die and second chip die are electrically connected by a TSV. In one embodiment, an unpackaged set of chips (e.g. 100a and/or 100b) is a 3-D stacked chip that includes multiple chips connected via TSVs or other suitable electrical connections. In one embodiment, an unpackaged set of chips (e.g. 100a and/or 100b) includes one or more interposers and may include one or more other types of chips as well. In this embodiment, through substrate vias pass through part of all of one or more of the chips in the unpackaged set of chips to connect each chip in the unpackaged set of chips. In one embodiment, the unpackaged sets chips 100 may include multiple unpackaged sets of chips, wherein one or more sets have different heights from other sets. For example, the unpackaged sets of chips 100 may include an unpackaged set of chips 100a that has a first chip die, with a second chip die and a third chip die stacked thereon, and an unpackaged set of chips 100b that has a first chip die, with a second chip die stacked thereon. In one embodiment, the unpackaged sets of chips 100 may include multiple unpackaged sets of chips of different types. For example, an unpackaged set of chips 100a may include one or more memory chips and one or more interposers, while an unpackaged set of chips 100b may include one or more interface circuits (e.g. controller chips or master chips) and one or more core chips (e.g. memory chips or slave chips). In one embodiment, one or more of the plurality of unpackaged sets of chips 100 may be identical to one another.

In one embodiment, an unpackaged set of chips (e.g. 100a) includes connection terminals that are exposed to the outside of the unpackaged set of chips and connected to the probe. In another embodiment, a portion of each of the unpackaged sets of chips 100 may be exposed. For example, the entire upper surface of each unpackaged set of chips may be exposed. In another example, a portion of the upper surface of each unpackaged set of chips is exposed. In another embodiment, at least a portion of the upper surface of each unpackaged set of chips is exposed. In this embodiment, an unpackaged set of chips 100a may have a different amount of upper surface exposed than an unpackaged set of chips 100b. For example, an unpackaged set of chips 100a may have chip pads on its upper surface that are exposed, and n unpackaged set of chips 100b may have its entire surface exposed. The different types of exposure of the upper surfaces of the unpackaged sets of chips are not limited to the examples described herein. In this embodiment, each unpackaged set of chips 100a and 100b has at least an identical portion of the upper surface of the unpackaged set of chips 100a and 100b exposed. For example, each unpackaged set of chips 100a and 100b may have at least one connection terminal that is exposed to the outside.

In one embodiment, the unpackaged sets of chips 100 may include unpackaged sets of chips of different heights that are simultaneously inserted into the sockets 122 of the probe card to be inspected. In one embodiment, the unpackaged sets of chips 100 may include unpackaged sets of chips with different types of semiconductor devices stacked thereon that are simultaneously inserted into the sockets 122 of the probe card to be inspected.

After one or more unpackaged sets of chips (e.g., 100a and/or 100b) are inserted into respective sockets 122, the cover plate 140 may be lowered to pressurize the unpackaged sets of chip such that the respective input/output terminals (e.g., 102a and/or 102b) of the unpackaged sets of chips make contact with respective probes 134 of respective probe blocks 132. The probes 134 may include one or more probes (e.g., 134a and/or 134b), such that each probe makes contact with an input/output terminal of an unpackaged set of chips. An input/output terminal of an unpackaged set of chips may be, for example, a connectional terminal including, for example, a chip pad, a conductive bump and/or a conductive ball. As mentioned above, an input/output terminal of an unpackaged set of chips may be exposed.

In one embodiment, a pressure member (e.g., 142a) corresponding to a socket (e.g., 122a) is moved upwards or downwards to pressurize an unpackaged set of chips (e.g., 100a). As discussed above, the height and pressure applied by each pressure exerting unit may vary according to the size and/or type of unpackaged set of chips disposed in a respective socket. In addition, if different unpackaged sets of chips having different heights are placed in different sockets at the same time, corresponding pressure exerting units for different unpackaged sets of chips may be at different heights and/or exert different pressures from each other. After contact is made between the input/output terminals of an unpackaged set of chips and the probes, the tester is able to inspect electrical properties of an unpackaged set of chips disposed in a respective one of the plurality of sockets. The tester may send different tests to each unpackaged set of chips (e.g., 100a and 100b) that is being tested, depending on the type of unpackaged set of chips disposed in the socket.

In one embodiment, the main circuit board 110 may include programming or an input capability to enable the main circuit board 110 to determine which test signals to send to each probe block 132. In one embodiment, the main circuit board 110 may send a different type of test signal to each probe block (e.g., 132a, 132b) to test an unpackaged set of chips. For example, the main circuit board 110 may send a first test signal to test an unpackaged set of chips 100a, which may include a logic circuit. The main circuit board 110 may send a second test signal to test an unpackaged set of chips 100b, which may be a memory chip set.

In one embodiment, an unpackaged set of chips may include a number of identical chips disposed next to each other. The identical chips may be a group of chips that were singulated from a wafer in a group, such that the chips are separated by scribe lines. In one embodiment, the width of the unpackaged set of chips (which comprises the group of identical chips) is equal to or less than the width of the respective socket. For example, an unpackaged set of chips (e.g., 100a) may include four identical chips cut from a single wafer in a group. All four chips in the unpackaged set of chips may be tested in one socket at the same time, with connection terminals from each of the four chips in the unpackaged set of chips connected to I/O terminals and probes of a respective probe block. The main circuit board 110 may send corresponding test signals to each of the four identical chips of the unpackaged set of chips. In this embodiment, the main circuit board 110 may still send different test signals to the different probe blocks 132 based on the type of unpackaged chips disposed in the respective sockets.

In example embodiments, the probe card may include a frame having a plurality of sockets for receiving respective unpackaged sets of chips. In one embodiment, an unpackaged set of chips comprises a chip stack that may be inserted into a corresponding socket of the probe card, to determine whether or not the respective chip stack is defective.

Hereinafter, a method of testing a semiconductor device using the probe card in FIG. 1 will be explained.

FIGS. 5 to 12 are views illustrating a method of testing a semiconductor device in accordance with example embodiments.

Figure 5:
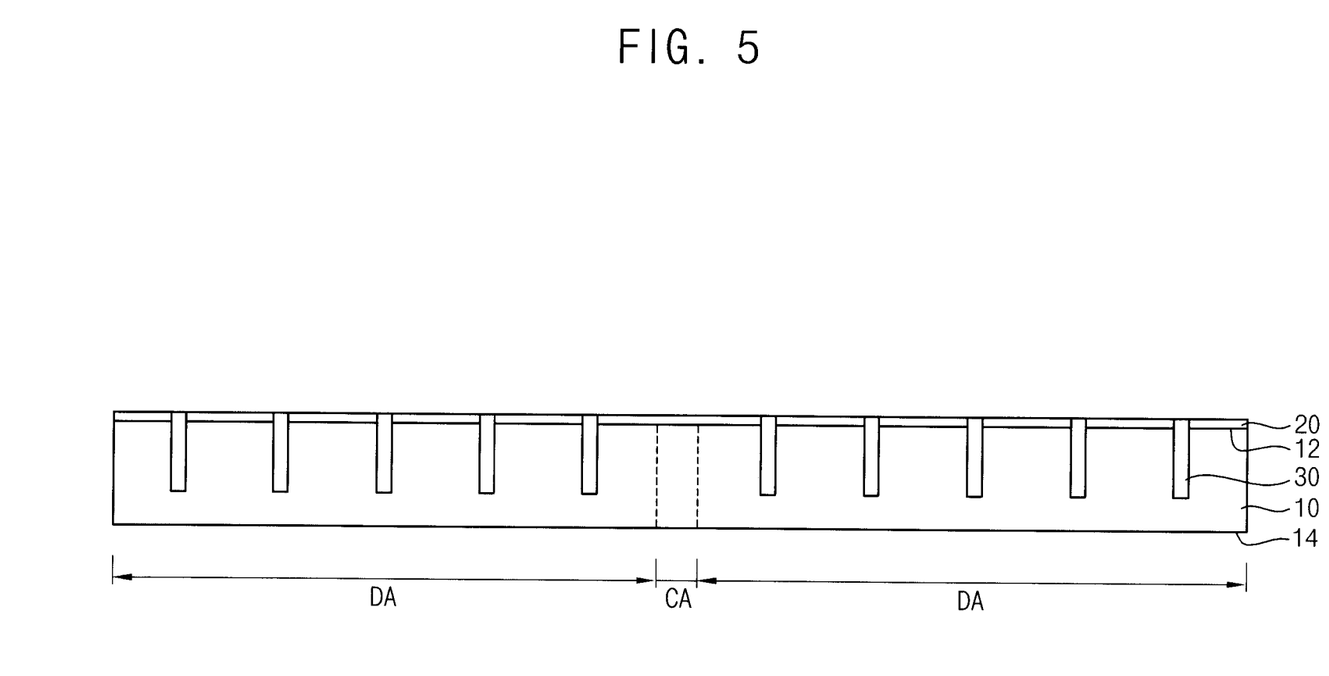
FIGS. 5 to 12 are views illustrating an exemplary method of testing a semiconductor device.

Referring to FIG. 5, a substrate 10 having a first surface 12 and a second surface 14 opposite to the first surface 12 may be prepared. The substrate 10 may be, for example, a single-crystalline silicon wafer. Other suitable types of wafers may also be used for the substrate 10. The substrate 10 may include a die region (DA) and a cutting region (CA). A plurality of circuit elements may be formed in the die region (DA).

Circuit patterns (not illustrated) may be formed on the first surface 12 of the substrate 10. An insulation interlayer 20 may be formed on the first surface 12 of the substrate 10 to cover the circuit patterns. For example, the circuit pattern may include a transistor, a diode, a capacitor, etc. The circuit patterns may constitute circuit elements (not shown). The semiconductor device may be a semiconductor chip including a plurality of the circuit elements formed therein.

The circuit element may include, for example, a plurality of memory devices. The memory devices may include one or more volatile memory devices and/or one or more non-volatile memory devices. The volatile memory devices may be, for example, DRAM, SRAM, etc. The non-volatile memory devices may be, for example, EPROM, EEPROM, Flash EEPROM, etc.

A wafer process (FEOL (front-end-of-line) process) may be performed to form the circuit patterns on the substrate 10.

Then, a plurality of through electrodes 30 may be formed in the substrate 10 to extend from the first surface 12 of the substrate 10 in a direction along the depth of the substrate 10 (e.g., toward the second surface 14).

After a photoresist layer (not illustrated) is formed on the insulation interlayer 20 on the substrate 10, the photoresist layer may be patterned to form a photoresist pattern (not illustrated) that exposes a region for a through electrode to be formed. The insulation interlayer 20 and the substrate 10 may be partially etched using the photoresist pattern as an etching mask to form the opening. For example, the opening may be formed by a dry etch process or a wet etch process. The depth of the opening may be determined in consideration of the length of a through electrode, the thickness of a stack package, etc. Then, the photoresist pattern may be removed from the substrate 10.

A through electrode 30 may be formed to fill the opening. For example, a seed layer may be formed conformally on sidewalls and a bottom surface of the opening and an upper surface of the insulation interlayer 20. The seed layer may be used as an electrode to form the through electrode 30 in the opening. Alternatively, the through electrode 30 may be formed by a chemical vapor deposition process. The method by which the through electrode 30 is formed is not limited to the examples described herein.

Figure 6:
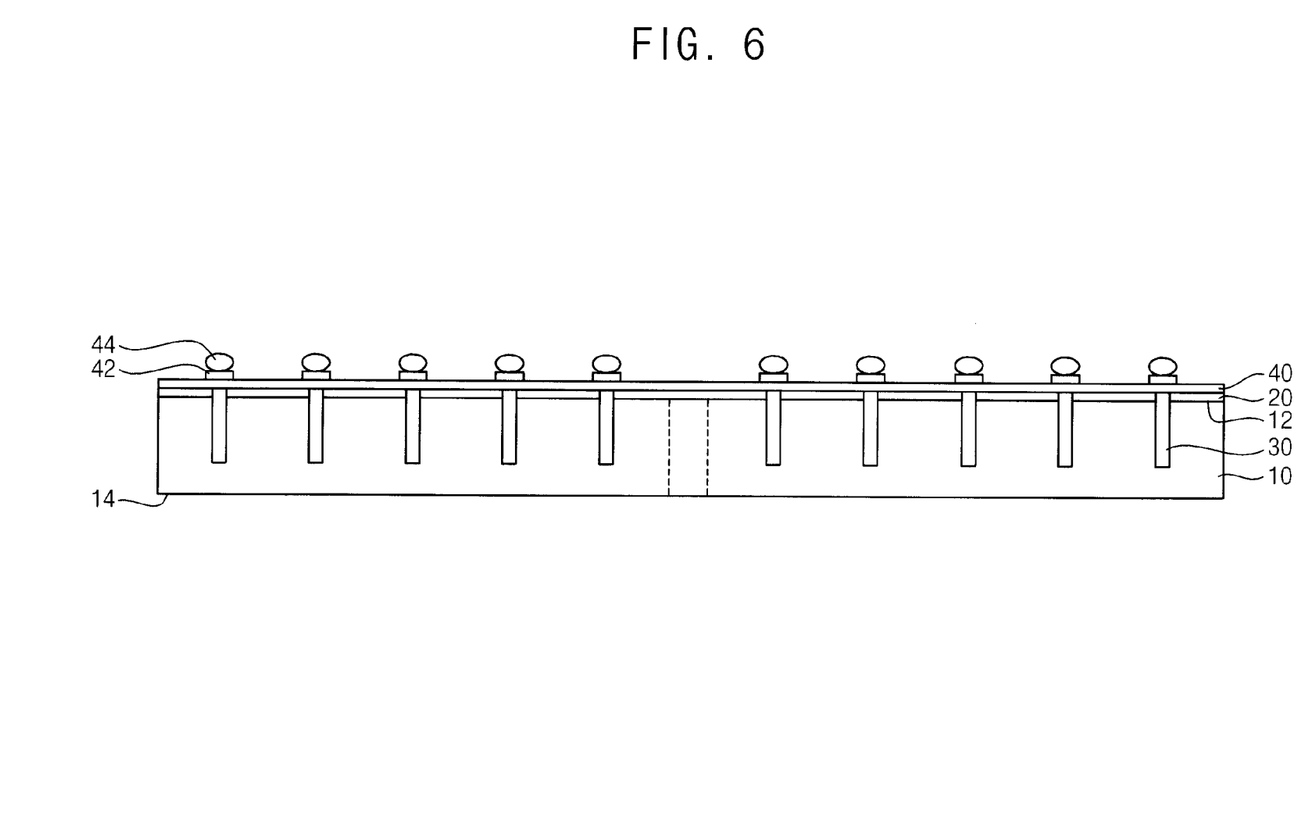

Referring to FIG. 6, an upper wiring layer 40 may be formed on the first surface 12 of the substrate 10. For example, a wiring process (BEOL (back-end-of-line) process) may be performed to form the upper wiring layer 40 on the first surface of the substrate 10. The upper wiring layer 40 may include upper wirings. The upper wirings may be electrically connected to the circuit pattern and the through electrode 30.

In particular, the upper wiring layer 40 may include a first inter-metal dielectric (IMD) layer and a second IMD layer. The first IMD layer may be formed on the insulation interlayer 20. The first IMD layer may include first upper wirings (not illustrated) electrically connected to the through electrode 30. The second IMD layer may be formed on the first IMD layer. The second IMD layer may include second upper wirings (not illustrated) electrically connected to the first upper wirings.

The second IMD layer may be partially removed to form one or more first connection pads 42. The first connection pads 42 may be electrically connected to the uppermost second upper wirings. A first connection member 44 may be formed on each first connection pad 42. The first connection member 44 may be a conductive bump, a solder ball, or any other suitable connection member.

Thus, a plurality of first chip dies having through electrodes may be formed in the wafer.

Figure 7:
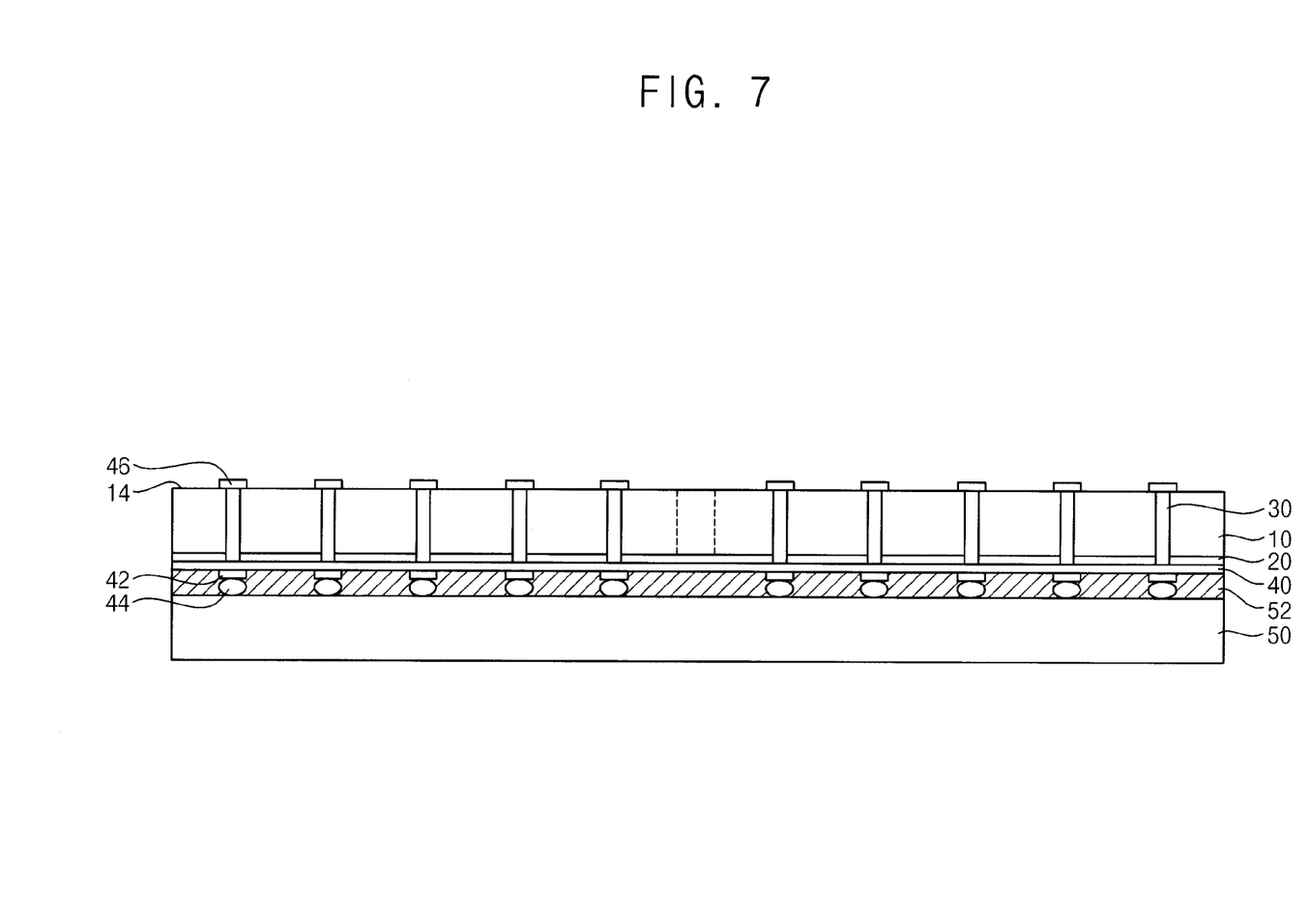

Referring to FIG. 7, a first handling substrate 50 may be adhered to the upper wiring layer 40. For example, the first handling substrate 50 may be adhered to the substrate 10 by a first adhesive layer 52. The first handling substrate 50 may be later removed from the substrate 10 after performing a process for stacking first and second chip dies.

The backside of the substrate 10 may be planarized to expose the through electrode 30 from the second surface 14 of the substrate 10. One or more second connection pads 46 may be formed on the second surface 14 of the substrate 10 to be electrically connected to the through electrode 30.

Figure 8:
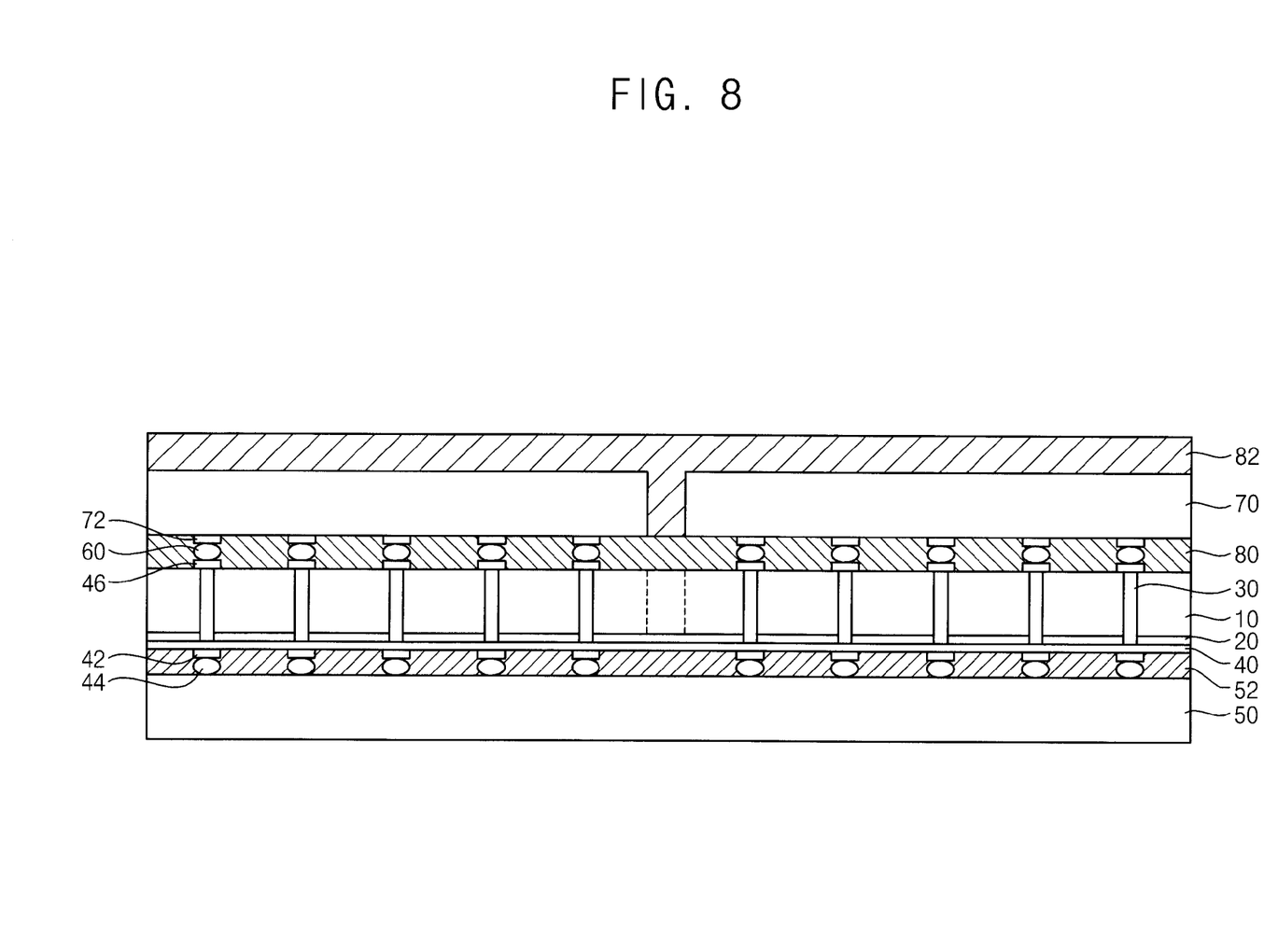

Referring to FIG. 8, a plurality of second chip dies 70 may be stacked on the second surface 14 of the substrate 10.

The second chip dies 70 may be adhered to the substrate 10 by a second adhesive layer 80. Each of the chip dies may include one or more third connection pads 72. Each third connection pad 72 of the second chip die 70 may be electrically connected to a second connection pad 46 by a second connection member 60. The second connection member 60 may be a solder ball, a conductive bump, or any other suitable connection member. The second chip dies 70 may be electrically connected to the substrate 10 or to an external device by the through electrode 30.

An insulation layer 82 may be formed to cover the chip dies 70. The second chip dies 70 may be stacked on the first chip dies.

Figure 9:
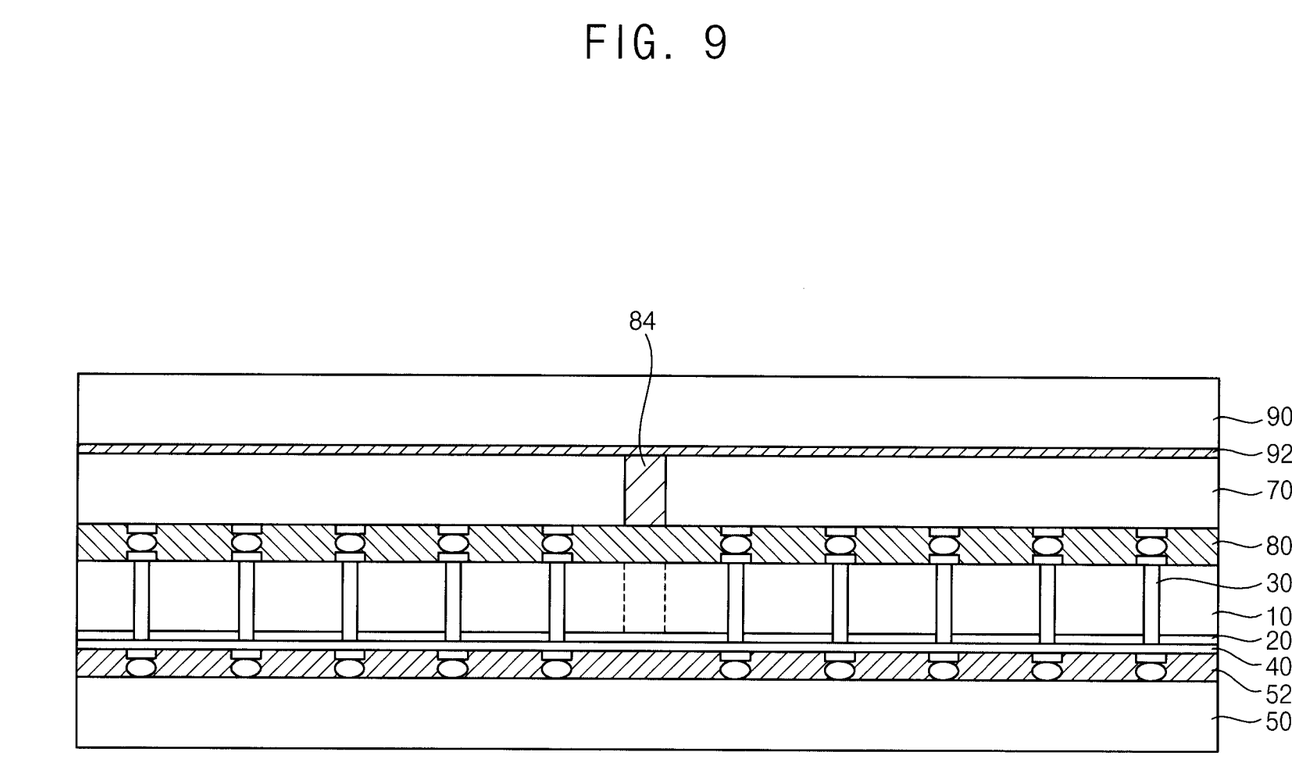
Figure 10:
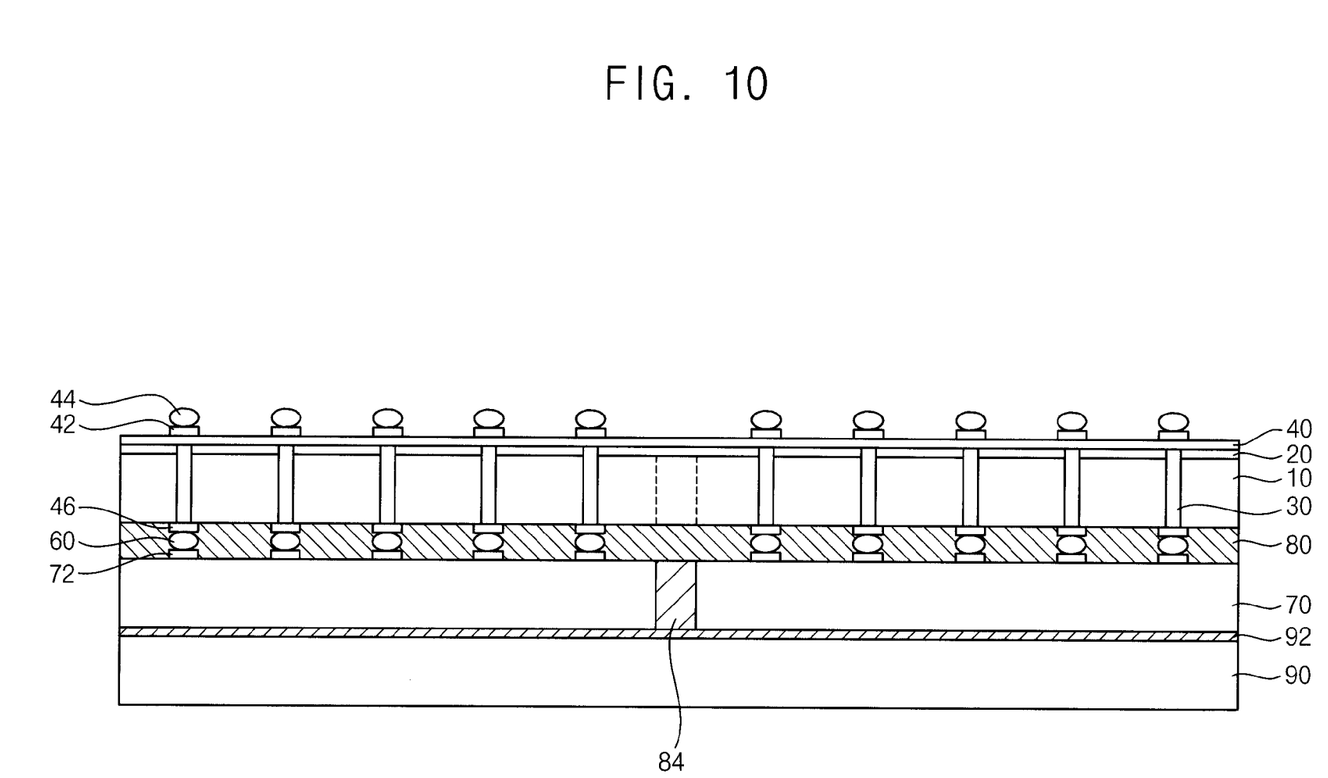
Figure 11:
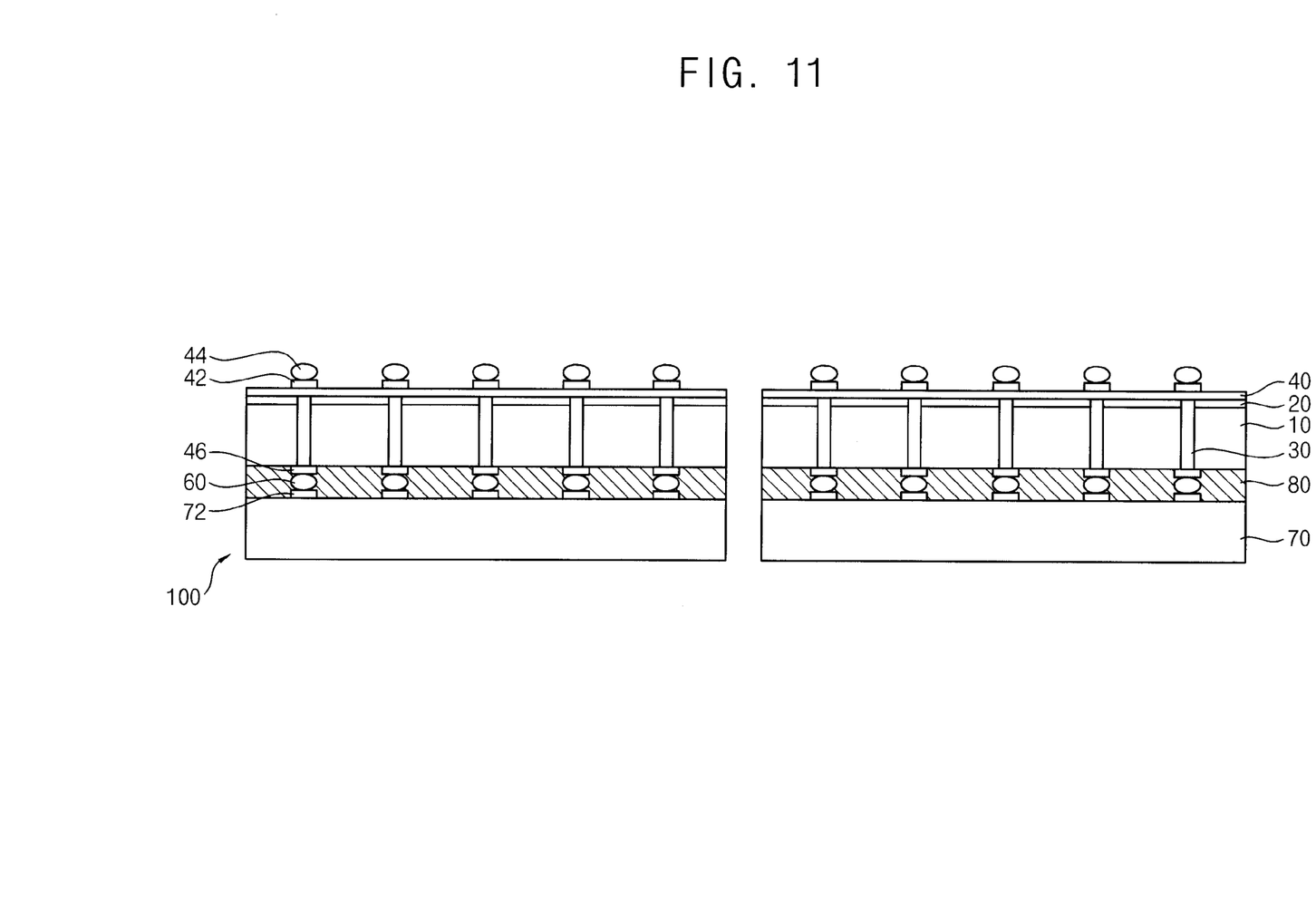

Referring to FIGS. 9 to 11, the insulation layer 82 is partially removed, leaving a leftover insulation layer 84 between the second chip dies 70. The leftover insulation layer 84 may be part of the cutting region (CA) of the wafer. The leftover insulation layer 84 may be, for example, a scribe line. Alternatively, in one embodiment, the second chip dies may be part of a wafer having a die region and a cutting region that correspond to the die region and cutting region of the substrate 10. In this embodiment, a wafer including second chip dies is stacked on the substrate 10 to form stacked dies having scribe regions for cutting. After the insulation layer 82 is partially removed or, if no insulation layer 84 is used for wafer-on-wafer stacking, a second handling substrate 90 may be adhered to the second chip dies 70. For example, the second handling substrate 90 may be adhered to the second chip dies 70 by a third adhesive layer 92.

Then, the first handling substrate 50 may be removed from the substrate 10. After the first handling substrate 50 is removed from the substrate 10, the first connection member 44 may be exposed from the substrate 10. The first connection member 44 and connection pad 42 may form together a connection terminal for connecting outside the chip dies. The connection terminal may be exposed to the outside of the substrate.

Next, the substrate 10 may be diced along the cutting region (CA), to form unpackaged sets of chips 100.

Figure 12:
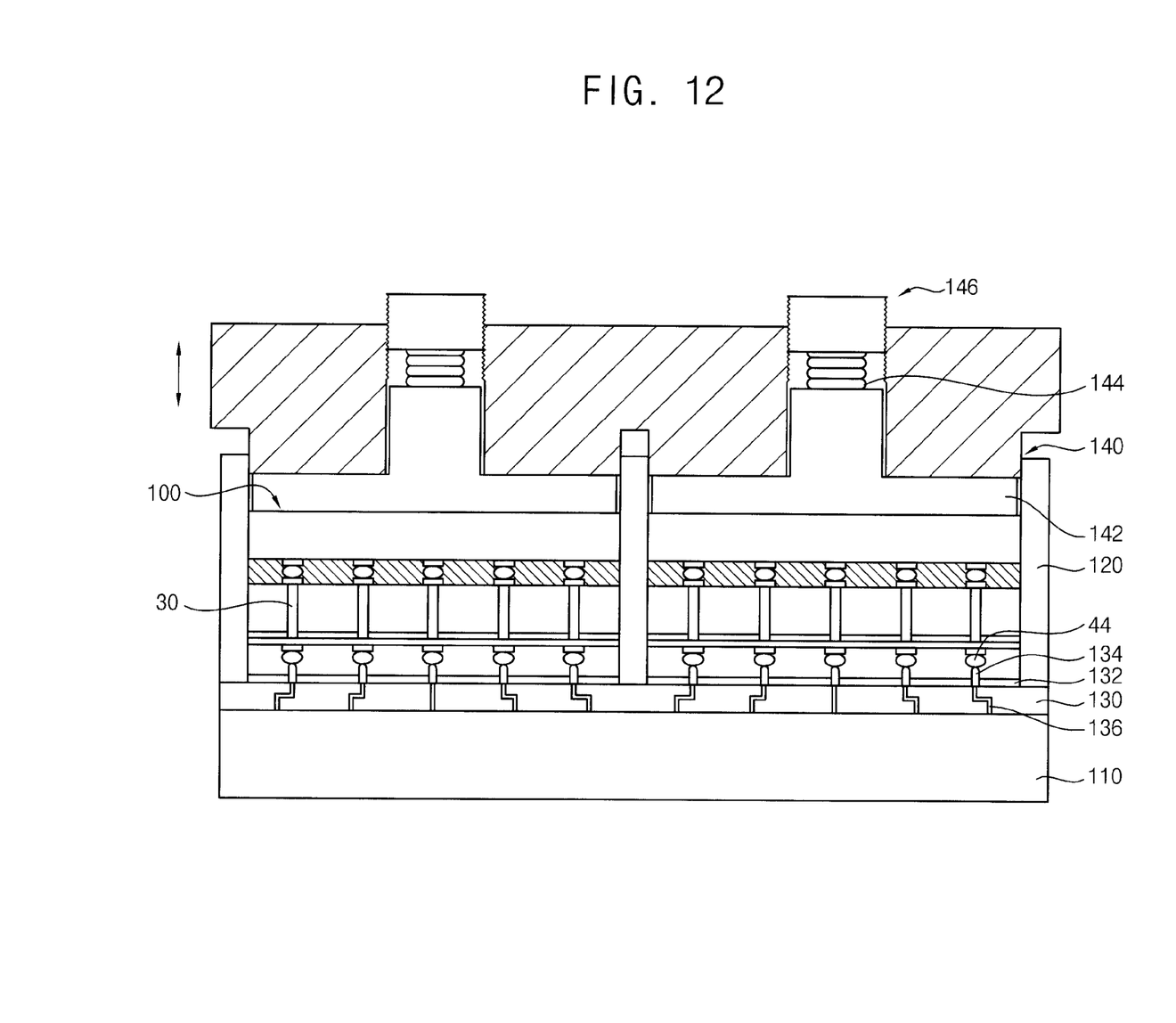

Referring to FIG. 12, the diced unpackaged sets of chips 100 may be inserted into the sockets 122 of the probe card in FIG. 1, and then, the cover plate 140 may pressurize the unpackaged sets of chips 100 such that input/output terminals of the unpackaged sets of chips 100 make contact with the probes 134 of the probe block 132, to inspect electrical properties of the unpackaged sets of chips 100. In one embodiment, the input/output terminals of each unpackaged set of chips are first connection terminals of the unpackaged set of chips that may include, for example, a connection member and/or a connection pad as described above. As discussed above, the height and pressure applied by each pressure exerting unit may vary according to the size and/or type of unpackaged set of chips disposed in each socket.

FIG. 12 is a cross-sectional view illustrating operation of the probe card in FIG. 1. As illustrated in FIG. 12, in an example embodiment, the cover plate may be positioned over the frame 120 and the pressure member 142 may pressure the unpackaged sets of chips 100 such that the unpackaged sets of chips 100 disposed in the plurality of sockets 122 are electrically connected to the probe card. As mentioned above, the unpackaged sets of chips 100 may include one or more identical unpackaged sets of chips, or may include unpackaged sets of chips of different heights and/or with different types of semiconductor devices.

Each unpackaged set of chips may then be tested. In one embodiment, different unpackaged sets of chips inserted into different respective sockets are tested simultaneously. The different unpackaged sets of chips may have different heights and/or include different types of devices. After a testing process is performed on the unpackaged sets of chips 100, each of the unpackaged sets of chips 100 may be stacked with additional elements, such as other chips, a package substrate and/or a molding to manufacture a system-in package. Other types of packaging may also be done to the individual unpackaged sets of chips, based on the height of the unpackaged set of chips and the type of circuit elements contained thereon.

Figure 13:
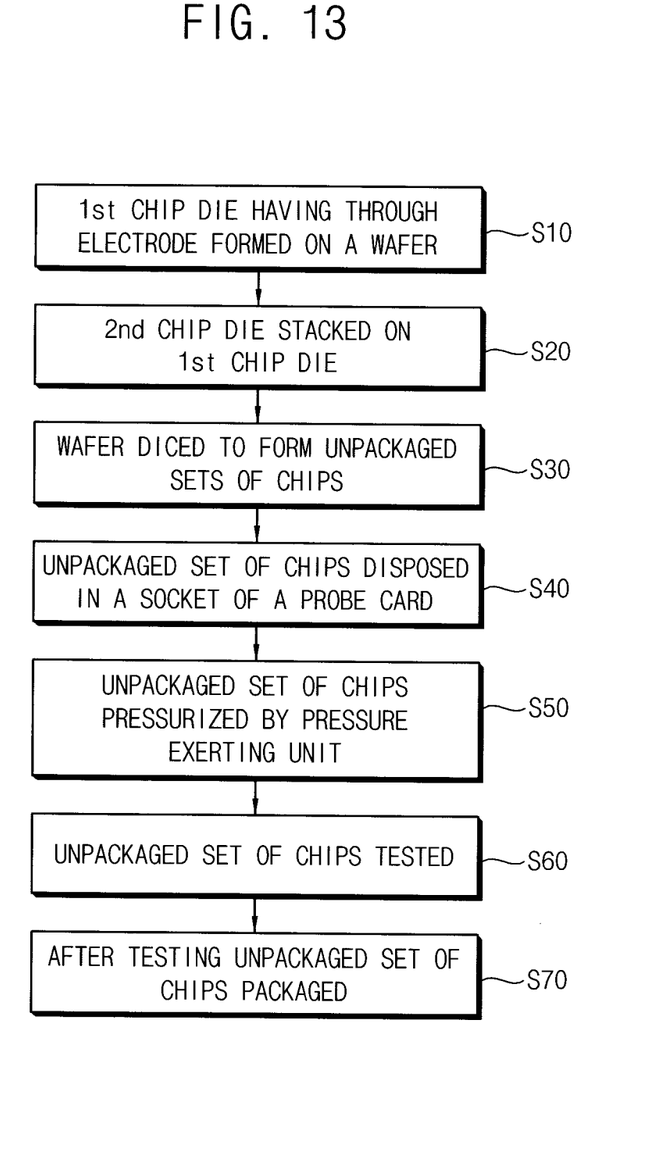
FIG. 13 is a flowchart showing an exemplary operation of manufacturing a semiconductor device.

Referring to FIG. 13, an exemplary method of manufacturing a semiconductor device will be described.

In step S10, a first chip die having a through electrode is formed in a wafer. In step S20, a second chip die is stacked on the first chip die. In step S30, the stacked first and second chip dies are cut from the wafer to form an unpackaged set of chips. In one embodiment, a connection terminal of the first chip die is exposed outside the substrate. In step S40, the unpackaged set of chips is inserted in a socket of a probe card. In step S50, a pressure exerting unit of the probe card pressurizes the unpackaged set of chips such that the exposed connection terminal of the unpackaged set of chips contacts probes of a respective probe block in the probe card. In step S60, the unpackaged set of chips is tested. In one embodiment, the sockets in the probe card may hold unpackaged sets of chips that are cut from one or more wafers. As mentioned above, the unpackaged sets of chips may be sets having different heights and/or with different elements. A different test signal may be sent to each unpackaged set of chips depending on the type of chips included in the unpackaged set of chips. In step S70, after the unpackaged set of chips is tested, the unpackaged set of chips is packaged. In this step, for example, the unpackaged set of chips may be connected to a package substrate and/or encased in a protective resin such as a mold layer.

As mentioned above, a probe card in accordance with example embodiments may include a frame having a plurality of sockets for respectively receiving a plurality of unpackaged sets of chips. Accordingly, unpackaged sets of chips diced from a wafer may be inspected separately from one another using the same probe card, even if the unpackaged sets of chips have different elements or different sizes, to determine whether or not each respective unpackaged set of chips is defective.

The above-disclosed subject matter is to be considered illustrative and not restrictive, and the appended claims are intended to cover all such modifications, enhancements, and other embodiments, which fall within the true spirit and scope of the disclosed embodiments. Thus, the invention is to be determined by the broadest permissible interpretation of the following claims and their equivalents, and shall not be restricted or limited by the foregoing detailed description.

What is claimed is:

1. A probe card, comprising:
    a main circuit board electrically connected to a tester in order to test at least a first unpackaged set of chips and at least a second unpackaged set of chips;
    a frame provided on the main circuit board, the frame including at least a first socket configured to receive the first unpackaged set of chips and at least a second socket configured to receive the second unpackaged set of chips; and
    a cover plate positioned over the frame, the cover plate comprising:
        a first movable member configured to maintain a position of the first unpackaged set of chips in the first socket during testing of the first unpackaged set of chips; and
        a second movable member configured to maintain a position of the second unpackaged set of chips in the second socket during testing of the second unpackaged set of chips,
        wherein the first movable member is configured to move independently of the second movable member, and
    wherein the first unpackaged set of chips comprises:
        at least a first chip die including a through-via; and
        at least a second chip die stacked on the first chip die and electrically connected the first chip die,
        wherein the first chip and second chip die are not connected to a package substrate.

2. The probe card of claim 1, wherein the first unpackaged set of chips includes a set of chips cut from one or more wafers and the second unpackaged set of chips includes a set of chips cut from one or more wafers.

3. The probe card of claim 1, wherein the cover plate further comprises:
    a first elastic member configured to support the first movable member.

4. The probe card of claim 3, wherein the cover plate further comprises:
a second elastic member configured to support the second movable member.

5. The probe card of claim 1, wherein the cover plate further comprises:
a first adjustment member configured to control a height of the first movable member.

6. The probe card of claim 5, wherein the cover plate further comprises:
a second adjustment member configured to control a height of the second movable member.

7. The probe card of claim 1, wherein the first movable member maintains the position of the first unpackaged set of chips during testing of the first unpackaged set of chips in a manner different than second movable member maintains the position of the second unpackaged set of chips during testing of the second unpackaged set of chips.

8. The probe card of claim 1, wherein the tester is configured to send a first test signal to the first unpackaged set of chips and a second test signal to the second unpackaged set of chips, wherein the first test signal is different from the second test signal.

9. A probe card, comprising:
a main circuit board electrically connected to a tester in order to test at least a first unpackaged set of chips and at least a second unpackaged set of chips;
a frame provided on the main circuit board, the frame including at least a first socket configured to receive the first unpackaged set of chips and at least a second socket configured to receive the second unpackaged set of chips; and
a cover plate positioned over the frame, the cover plate comprising:
a first pressure member configured to pressurize the first unpackaged set of chips; and
a second pressure member configured to pressurize the second unpackaged set of chips,
wherein the first pressure member pressurizes the first unpackaged set of chips in a manner different than the second pressure member pressurizes the second unpackaged set of chips,
wherein the first unpackaged set of chips comprises:
at least a first chip die including a through-via; and
at least a second chip die stacked on the first chip die and electrically connected the first chip die,
wherein at least the first input/output terminal of the first unpackaged set of chips is exposed.

10. The probe card of claim 9, wherein the first pressure member is configured to move in a vertical direction to correspond to a first height of the first unpackaged set of chips and the second pressure member is configured to move in a vertical direction to correspond to a second height of the second unpackaged set of chips.

11. The probe card of claim 10, wherein the cover plate further comprises:
a first adjustment member configured to control a height of the first pressure member; and
a second adjustment member configured to control a height of the second pressure member.

12. The probe card of claim 9, wherein the cover plate further comprises:
a first elastic member configured to support the first pressure member; and
a second elastic member configured to support the second pressure member.

13. The probe card of claim 9, wherein the tester is configured to provide a first test signal to the first unpackaged set of chips and a second test signal to the second unpackaged set of chips, wherein the first test signal is different from the second test signal.

14. A semiconductor device, comprising:
a first set of chips tested by the probe card of claim 1;
a package substrate stacked with the first set of chips; and
a mold formed on the stacked first set of chips and package substrate,
wherein the first set of chips, the package substrate, and the mold comprise a package.

15. A probe card, comprising:
a main circuit board including a plurality of probes, and electrically connected to a tester in order to test at least a first unpackaged set of chips and at least a second unpackaged set of chips;
a frame provided on the main circuit board, the frame including at least a first socket configured to receive the first unpackaged set of chips and at least a second socket configured to receive the second unpackaged set of chips; and
a cover plate positioned over the frame, the cover plate comprising:
a first pressure member configured to pressurize the first unpackaged set of chips such that exposed input/output terminals of the first unpackaged set of chips contact corresponding first probes, wherein the first pressure member is configured to be individually inserted into the first socket to pressurize the first unpackaged set of chips; and
a second pressure member configured to pressurize the second unpackaged set of chips such that exposed input/output terminals of the second unpackaged set of chips contact corresponding second probes, wherein the second pressure member is configured to be individually inserted into the second socket to pressurize the second unpackaged set of chips,
wherein the first pressure member is configured to move independently of the second pressure member.

16. The probe card of claim 15, wherein the first unpackaged set of chips comprises:
a first chip die including a plurality of through-substrate vias and the exposed input/output terminals; and
at least a second chip die stacked on the first chip die and electrically connected to the first chip die through the through-substrate vias.

17. The probe card of claim 15, wherein the first pressure member is configured to move in a vertical direction to correspond to a first height of the first unpackaged set of chips and the second pressure member is configured to move in a vertical direction to correspond to a second height of the second unpackaged set of chips, wherein the first height is different from the second height.

18. The probe card of claim 15, wherein the cover plate further comprises:
a first adjustment member configured to control a height of the first pressure member; and
a second adjustment member configured to control a height of the second pressure member.

19. The probe card of claim 15, wherein the cover plate further comprises:
a first elastic member configured to support the first pressure member; and
a second elastic member configured to support the second pressure member.

20. The probe card of claim 15, wherein the tester is configured to provide a first test signal to the first unpackaged set of chips and a second test signal to the second unpackaged set of chips, wherein the first test signal is different from the second test signal.

* * * * *